(12) United States Patent
Kovarik et al.

(10) Patent No.: US 10,431,419 B2
(45) Date of Patent: Oct. 1, 2019

(54) SPARSE SAMPLING METHODS AND PROBE SYSTEMS FOR ANALYTICAL INSTRUMENTS

(71) Applicant: BATTELLE MEMORIAL INSTITUTE, Richland, WA (US)

(72) Inventors: Libor Kovarik, West Richland, WA (US); Andrew J. Stevens, Richland, WA (US); Andrey V. Liyu, Pasco, WA (US); Nigel D. Browning, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 23 days.

(21) Appl. No.: 15/643,862

(22) Filed: Jul. 7, 2017

(65) Prior Publication Data
US 2018/0025887 A1    Jan. 25, 2018

Related U.S. Application Data

(60) Provisional application No. 62/364,176, filed on Jul. 19, 2016.

(51) Int. Cl.
*H01J 37/26* (2006.01)
*G01Q 10/00* (2010.01)
*H01J 37/22* (2006.01)
*H01J 37/28* (2006.01)

(52) U.S. Cl.
CPC .......... *H01J 37/222* (2013.01); *H01J 37/28* (2013.01); *H01J 2237/226* (2013.01); *H01J 2237/2802* (2013.01); *H01J 2237/2809* (2013.01)

(58) Field of Classification Search
CPC .... H01J 37/222; H01J 37/28; H01J 2237/226; H01J 2237/2802; H01J 2237/2809; G01Q 10/00
See application file for complete search history.

(56) References Cited

U.S. PATENT DOCUMENTS

| 5,866,806 A | 2/1999 | Samsavar et al. |
| 6,571,612 B2 | 6/2003 | Watanabe |

(Continued)

FOREIGN PATENT DOCUMENTS

JP    59-078436 A    7/1984

OTHER PUBLICATIONS

Stevens et al., 'The potential for Bayesian compressive sensing to significantly reduce electron dose in high-resolution STEM images' Feb. 1, 2014, Microscopy, vol. 63, Issue 1, p. 41-51.*

(Continued)

*Primary Examiner* — Eliza W Osenbaugh-Stewart
(74) *Attorney, Agent, or Firm* — Klarquist Sparkman, LLP

(57) ABSTRACT

Sparse sampling approaches and probe systems for analytical instruments are disclosed providing for effective sub-sampling of a specimen and inpainting to reconstruct representations of actual information. The sub-sampling involves serial acquisition of contiguous measured values lying at positions along a scan path extending in a line toward a first direction and having random perturbations in a second direction. The perturbations are limited within a predetermined distance from the line. Inpainting techniques are utilized among the measured values to reconstruct a representation of actual information regarding the specimen.

26 Claims, 8 Drawing Sheets

(56) References Cited

U.S. PATENT DOCUMENTS

| | | |
|---|---|---|
| 6,873,747 B2 | 3/2005 | Askary |
| 8,933,401 B1 | 1/2015 | Reed |
| 2006/0174384 A1 | 8/2006 | Roessler et al. |
| 2013/0262028 A1 | 10/2013 | De Prisco et al. |
| 2015/0069233 A1 | 3/2015 | Anderson et al. |
| 2015/0371815 A1 | 12/2015 | Potocek et al. |
| 2017/0018073 A1 | 1/2017 | Sungkorn et al. |

OTHER PUBLICATIONS

International Search Report/Written Opinion for International Application No. PCT/US2017/042856, International Filing Date Jul. 19, 2017, dated Oct. 23, 2017.

Lustig, M., et al., Compressed Sensing MRI [A look at how CS can improve on current imaging techniques], IEEE Signal Processing Magazine, 72, 2008, 1-11.

Anderson, H. S., et al., Sparse imaging for fast electron microscopy, Proc of SPIE—IS&T Electronic Imaging, SPIE vol. 8657, 2013, 86570C-1-86570C-12.

Beche, A., et al., Development of a fast electromagnetic beam blanker for compressed sensing in scanning transmission electron microscopy, Applied Physics Letters, 108, 2016, 093103-1-093103-5.

Stevens, A., et al., The potential for Bayesian compressive sensing to significantly reduce electron dose in high-resolution STEM images, Microscopy, 0, 2013, 1-11.

International Search Report and Written Opinion for related International Application No. PCT/US2018/043486, dated Nov. 9, 2018, 13 pages.

\* cited by examiner

SPARSE SAMPLING METHODS AND PROBE SYSTEMS FOR ANALYTICAL INSTRUMENTS

PRIORITY

This invention claims priority from U.S. Provisional Patent Application No. 62/364,176, entitled Accurate Sparse Sampling for Low-Dose STEM Imaging Using Only the Microscope Scan Coils filed Jul. 19, 2016.

ACKNOWLEDGEMENT OF GOVERNMENT SUPPORT

This invention was made with Government support under Contract DE-AC0576RL01830 awarded by the U.S. Department of Energy. The Government has certain rights in the invention.

FIELD

The invention relates generally to analytical instrumentation and computational imaging and the use of such analytical instrumentation and computational imaging, and particularly to sparse sampling with an analytical probe and inpainting to reconstruct representations of actual information.

BACKGROUND

Advances in analytical instruments, examples of which can include microscopes, spectrometers, and diffractometers, have dramatically improved the quantity and the quality of data obtainable by the instruments. For example, the spatial resolutions that can be achieved in specimen micrographs today are much more refined than that of the past. However, practically speaking, the quantity and quality of information obtainable is now often limited by observer effects on the specimen and/or acquisition times that are too long.

Application of computational imaging techniques to reconstruct representations of fully-sampled information from sparse datasets obtained by sub-sampling a specimen can theoretically minimize observer effects and acquisition times. However, operational limitations of the analytical instruments can prevent successful sub-sampling, which can make implementation of such computational imaging techniques difficult and/or impossible. Accordingly, there exists a need for sub-sampling and associated computational imaging techniques that minimize observer effects and acquisition times.

SUMMARY

Disclosed are methods for sparse sampling with an analytical probe. Also disclosed are sparse sampling analytical probe systems. The inventors determined that embodiments of the sparse sampling methods and analytical probe systems disclosed herein successfully solve the problem of high uncertainties regarding analytical probe position assignment during sparse sampling in a serial mode. The high uncertainty exists because the dynamic response of a positioning system moving the specimen and the analytical probe relative to one another can cause significant delays between the target and actual sampling locations. The inventors determined that inpainting among the measured values to determine imputed values for reconstructing a representation of actual information is distinguished from compressive sensing and is particularly effective in the serial modes of sampling associated with scanning analytical probes.

In one embodiment, a method for sparse sampling with an analytical probe comprises acquiring in a serial mode a plurality of contiguous measured values lying at positions along a scan path extending in a line toward a first direction and having random perturbations in a second direction, wherein the random perturbations are limited within a predetermined distance from the line. The method further comprises inpainting among the measured values and reconstructing a representation of actual information. In certain embodiments, the acquiring step is repeated at different portions of a sample region, thereby acquiring measured values over substantially the entire sample region In certain embodiments, a plurality of the lines are adjacent and resemble a serpentine line form or a sawtooth line form. In certain embodiments, the line has a curved form. In certain embodiments, the acquiring further comprises moving an analytical probe and a sample from which the measured values are acquired relative to one another. In certain embodiments, the acquiring further comprises holding an analytical probe at each of the positions from which measured values are acquired for a dwell time, the dwell time being less than a rise time associated with positional uncertainty of the analytical probe. In certain embodiments, the dwell time is greater than or equal to 50% of the rise time. In certain embodiments, the dwell time is between 70% and 90% of the rise time. In certain embodiments, the acquiring further comprises sensing a sample with a physical tip. In certain embodiments, the acquiring further comprises illuminating a sample with a charged particle beam, a neutral particle beam, an electromagnetic beam, or an optical beam.

In one embodiment, a sparse sampling analytical probe system comprises a positioning configured to move a sample and an analytical probe relative to one another and to scan the analytical probe over the specimen along a scan path extending in a line toward a first direction and having random perturbations in a second direction, wherein the random perturbations are limited within a predetermined distance from the line; a measurement system configured to acquire in a serial mode a plurality of contiguous measured values lying at positions along the scan path; and an inpainting reconstruction system configured to apply inpainting techniques based on the measured values and to reconstruct a representation of actual information. In certain embodiments, the analytical probe comprises a charged particle beam, a neutral particle beam, an electromagnetic beam, or an optical beam. In certain embodiments, the analytical probe has a substantially constant illumination intensity at every position at which a measured value is acquired. In certain embodiments, the positioning system comprises electromagnetic deflectors. In certain embodiments, the electromagnetic deflectors comprise scan coils. In certain embodiments, the positioning system comprises electrostatic deflectors. In certain embodiments, the analytical probe comprises a physical tip. In certain embodiments, the positioning system comprises piezoelectric manipulators, optical elements, or a combination thereof. In certain embodiments, the line comprises a continuous portion of a serpentine form or a sawtooth form. In certain embodiments, the line has a curved line form. In certain embodiments, the positioning system further configured to hold the analytical probe at each of the positions from which measured values are acquired for a dwell time, the dwell time being less than a rise time associated with positional uncertainty of the analytical probe. In certain embodiments, the dwell time is greater than or equal to 50% of the rise time. In certain embodiments, the dwell time is between 70% and 90% of the rise time. In certain embodiments, the inpainting reconstruction system comprises an inpainting solver stored in a memory device, the inpainting solver applying Bayesian dictionary learning techniques, beta-process factor analysis techniques, or combinations thereof. In certain embodiments, the representation of actual information comprises an image having N pixels, and the plurality of measured values is fewer than or equal to 20%, 30%, 40%, 50%, 60%, 70%, 80%, or 90% of the N pixels.

The purpose of the foregoing summary and the latter abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. Neither the summary nor the abstract is intended to define the invention of the application, which is measured by the claims, nor is it intended to be limiting as to the scope of the claims in any way.

BRIEF DESCRIPTION OF THE DRAWINGS

FIG. 2A shows a lateral line form with analytical probe flyback (dotted line). FIG. 2B is a sawtooth line form. FIG. 2C is a spiral polygon, particularly a quadrilateral line form. FIG. 2D a non-sinusoidal waveform, particularly a rectangular waveform, line form. FIG. 2E is a curved line form, particularly a spiral. FIG. 2F is another curved line form, particularly a serpentine or sinusoidal wave.

FIG. 4A is an illustration representing a two-dimensional Bernoulli sampling of a specimen as one example (for comparison purposes) of a fully random arrangement of sub-sampled sites by an analytical probe. FIG. 4B is a graph showing experimentally derived rise time for scan coils in a JEOL ARM 200 based on the assumption that the electron beam movement is dictated by induction in the scan coils. FIG. 4C is an illustration representing a "line-hop" sampling of a specimen, wherein a plurality of scan paths extend in a line toward a first direction and have random perturbations in a second direction according to embodiments of the present invention. FIGS. 4D and 4E are graphs showing simulated positions of the electron beam along X and Y axes, respectively, for dwell times corresponding to 80% of the rise time. FIG. 4F is a graph showing theoretically obtained peak signal-to-noise ratio (PSNR) from digitally sub-sampled Au standard images comparing Bernoulli random sampling and line-hop sampling like the scan patterns shown in FIGS. 1 and 2A.

FIG. 5A is a micrograph generated from a full data set obtained by fully sampling the NiTiO3 specimen. FIG. 5B is a micrograph generated from a sparse dataset obtained by line-hop sub-sampling at 50% the number of measured values contained in the full data set. FIG. 5C is a micrograph reconstructed from the sparse data set of FIG. 5B to represent a fully sampled micrograph like that shown in FIG. 5A. FIG. 5D is a micrograph generated from a sparse dataset obtained by line-hop sub-sampling at 20% the number of measured values contained in the full data set. FIG. 5E is a micrograph reconstructed from the sparse data set of FIG. 5D to represent a fully sampled micrograph like that shown in FIG. 5A. All data sets were acquired with a dwell time of 31.35 s.

FIG. 6A is a micrograph generated from a sparse dataset obtained by line-hop sub-sampling at 20%. FIG. 6B is a micrograph reconstructed from the sparse data set of FIG. 6A to represent a fully sampled micrograph. The sparse data set was acquired with a 6 pA electron beam probe having a dwell time of 31.35 s. The pixel size of the images is 0.2719, which is associated with a dose of 3175 $e/A^2$.

DESCRIPTION

Figure 1:
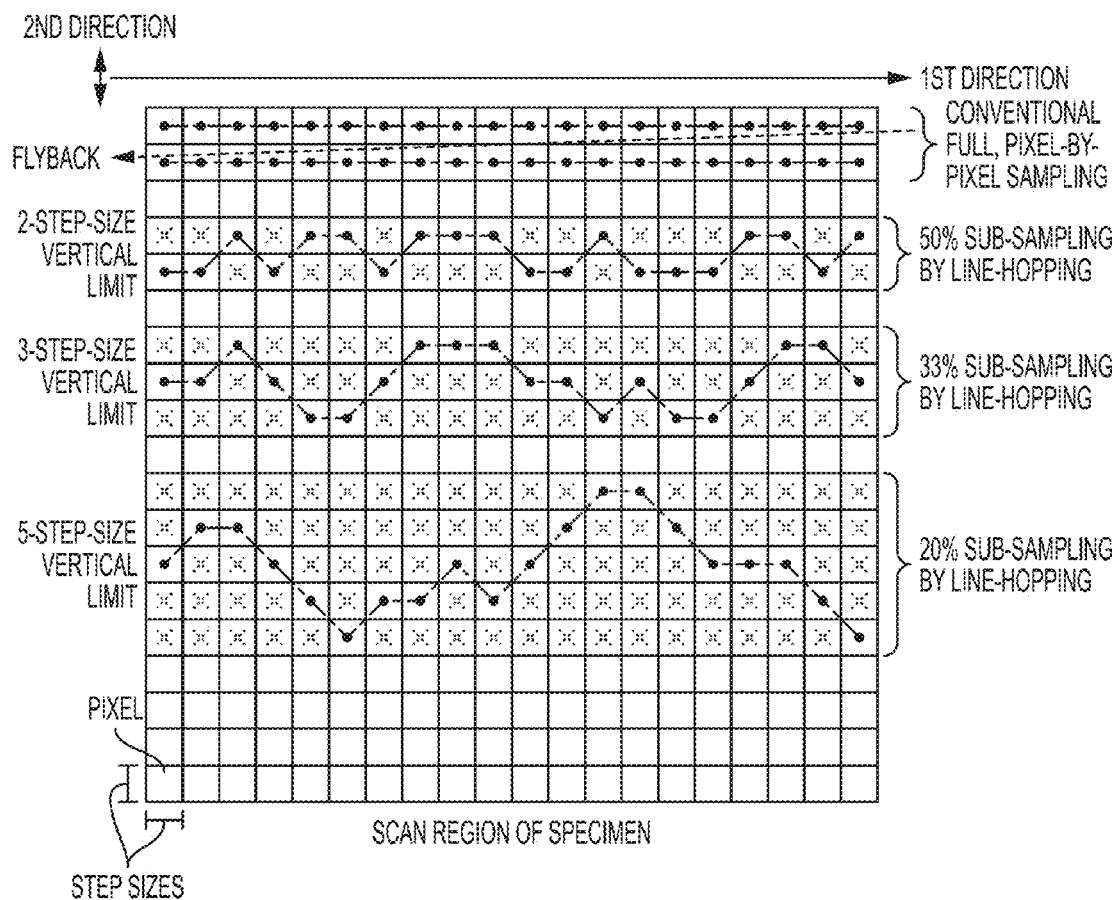
FIG. 1 is an illustration comparing a conventional raster scan path with 50%, 33%, and 20% line-hop sub-samplings according to embodiments disclosed herein.

Computational imaging techniques can enable significant reductions in total acquisition times as wells as in destructive observer effects on specimens analyzed by analytical instruments such as microscopes, spectrometers, and diffractometers. According to the present disclosure, useful information regarding a specimen can be well represented in a much sparser form using a suitable basis set. This suitable basis set can be fully recovered from significantly fewer measurements than conventional "pixel-by-pixel" acquisitions (hence reducing the observer effects). For example, in analytical instruments utilizing an electron beam probe, recovering a full micrograph from a sparse data set acquired by sub-sampling a specimen (compared to full pixel-by-pixel sampling), requires a shorter acquisition time and a lower dose (i.e., a lower exposure of the specimen to the electron beam), thereby minimizing electron-beam damage to the specimen.

In serial data acquisition modes, such as those used by analytical instruments in which an analytical probe is moved to scan a region of the specimen while making measurements, acquiring a sparse dataset requires positioning the analytical probe at the appropriate, random sparse measurement location. However, dynamics in the analytical probe positioning system can cause delays between the target probe position and the actual probe position. Examples of the poor dynamics affecting the control of the analytical probe can include oscillations in the position of the probe and hysteresis in movement of the probe. Rapid and/or large changes in probe position exacerbate the problems associated with probe positioning system dynamics. The problem of high uncertainties regarding analytical probe position assignment during sparse sampling in a scanned analytical probe system can inhibit practical implementation of computational imaging techniques and their associated advantages.

Embodiments for effectively sub-sampling a specimen and applying computational imaging techniques are disclosed. The embodiments comprise serial acquisition of contiguous measured values lying at positions along a scan path extending in a line toward a first direction and having random perturbations in a second direction. The perturbations are limited within a predetermined distance from the line. Inpainting techniques are utilized among the measured values to reconstruct a representation of actual information regarding the specimen.

In one embodiment, the time associated with altering the analytical probe position relative to the specimen given a particular step size is preferably less than the dwell time so as to ensure that the analytical probe steps can be realized in a shorter time duration than the dwell time selected for measurement at a given position. Accordingly, in certain embodiments, the dynamic response of the positioning system is evaluated to determine the range of dwell time durations and/or the range of step sizes available for moving the analytical probe (and/or the specimen). In one example, the analytical probe rise time is measured for a given analytical instrument to determine the response time for the analytical probe to reach a desired location on the specimen. In instances of slow analytical probe response (i.e., the rise time is equal to or greater than a desired dwell time) the dwell time is then restricted to a portion of the rise time.

The benefits of line-hopping sparse sampling include minimization of overall observer effects due to exposure to the analytical probe, in other words the total dose provided to the specimen. In some embodiments, the benefits also include minimization of acquisition time, when comparing it on the basis of constant dwell time per pixel to full sampling, and/or minimization of the dose-rate when comparing it on the basis of total acquisition time. In the cases of electron beam probes, electromagnetic probes, and charged particle probes the dose-rate can be related to probe beam current. Interrogating a specimen with lower beam currents conventionally requires increasing dwell time to obtain images with a comparable signal to noise ratio. The increase in dwell time results in prolonged exposures that are adversely affected by sample drift. Due to the time saving associated with sparse sampling, however, lowering the beam current and prolonging dwell times is enabled without prolonging overall acquisition time, thus minimizing the drift. The reduction of beam current is especially important for analyzing groups of oxides, carbonates, and other materials where both the total dose and dose rate play an important role in minimizing observer effects.

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

Unless otherwise indicated, descriptions regarding the movement and/or position of the analytical probe relative to the specimen can typically refer to the movement and/or position of the specimen relative to the analytical probe or to the movement and/or position of the analytical probe relative to the specimen. In some embodiments, the relative movement of one to the other can be implemented equivalently using either approach. In other embodiments, one approach is necessitated by context and/or limitations in positioning systems, analytical instruments, and/specimen requirements. In still other embodiments, both the analytical probe and the specimen can move in order to achieve the desired scan paths.

To facilitate review of the various embodiments of the disclosure, the following explanations of specific terms are provided:

Definitions and Abbreviations:

AFM as used herein means atomic force microscopy

Analytical instrument as used herein means a system useful for examining, indicating, measuring and/or recording the elements and/or structure of a specimen using an analytical probe. The system typically comprises at least some of sub-systems including a user interface, a specimen holder, an analytical probe, a positioning system, a detector, and processing circuitry for processing data acquired by the analytical probe and detector. Examples of analytical instruments can include, but are not limited to, AFM, optical analytical techniques, SEM, SIMS, TEM, and STEM.

Analytical probe as used herein means an apparatus, which can be a part of an analytical instrument, for interrogating a specimen to acquire analytical data regarding the specimen. The probe can utilize one or more of physical, optical, electromagnetic, neutral particle, and charged particle means for interrogating the specimen. Examples can include AFM nanotip probes, electron beam probes, ion beam probes, X-ray probes, and optical light probes.

Compressive sensing as used herein means the techniques and algorithms that permit reconstruction of a signal by detecting or sampling down to rates that are even below the Nyquist rate provided that the signal has a sparsity characteristic in some domain, such as the time domain, frequency domain, time-frequency domain, etc. and provided the signal is incoherent with respect to that domain. For example, in a conventional system, a signal having a single high frequency component would be sampled at twice this high frequency component in order to recreate the signal without loss. Because there is only one frequency component, the frequency domain for the signal is sparse. Using compressive sensing, knowledge of this sparsity can allow sampling the signal with minimal loss at a sampling rate substantially below the frequency of the single high frequency component (i.e., well below the Nyquist rate).

Dwell time as used herein means the duration of time that an analytical probe spends while sampling at a position on the specimen.

Image as used herein means a kind of depiction or representation of actual information regarding the specimen. It typically refers to a micrograph of the scanned region of a specimen, which micrograph is obtained from analytical instrument. It also includes, but is not limited to, spectroscopic maps, element maps, diffraction patterns, and hyperspectral images.

Imputed value as used herein means a computationally determined data point that is imputed using a mathematical technique, for example, one associated with inpainting.

Inpainting as used herein means the imputation of missing image pixels. This can be achieved using external information, such as a library of similar images or trained statistical models (e.g., neural networks), but also using only the reduced set of pixels from the image to be inpainted (e.g. beta-process factor analysis).

Line-hopping as used herein refers to various disclosed embodiments of sub-sampling with an analytical probe wherein the analytical probe acquires in a serial mode a plurality of contiguous measured values lying at positions along a scan path extending in a line toward a first direction and having random perturbations in a second direction, wherein the random perturbations are limited within a predetermined distance from the line.

Measured value as used herein means an acquired data point that is measured by the analytical probe at a location on the specimen and used to construct a representation of actual information. A measured value is contrasted with computationally determined values, for example imputed values.

Observer effects as used herein means the effects that an act of observation will make on a specimen being observed. The observer effects are the result of the analytical instrument, and particularly the analytical probe, altering the state of the specimen being examined. Examples of observer effects can include the compositional and structural damage caused by high doses of electrons and/or electromagnetic radiation by exposure to electron beam probes and/or electromagnetic beam probes, respectively. Similarly, an AFM nanotip probe can damage the surface of the specimen being examined.

Pixel as used herein in the context of an image means the basic logical unit in the image. As used herein in the context of sampling a specimen using an analytical probe, a pixel can refer to the basic logical unit in the scan region. Depending on the resolution of the image and the sampling rate of the analytical probe, a pixel in the image can represent one or more actual measurement positions where sampling by the analytical probe occurred. The relationship between sampling distance at the specimen and pixel size at the image can be described as the size of the pixel divided by the magnification in the image is equivalent to the sampling distance.

Rise time as used herein means the response time associated with a positioning system for an analytical probe to reach a target position on a specimen.

SEM as used herein means scanning electron microscopy.

Scan path as used herein means the route that the analytical probe traverses across the specimen as the probe acquires measurements.

Serial acquisition as used herein means acquiring data in serial order at particular positions as the analytical probe traverses a scan region of the specimen along a scan path. At each sampling position along the scan path in a single scan, acquisition of a measured value is performed. In contrast, a parallel acquisition performs plurality of acquisitions, wherein each acquisition encompasses an entirety of a scan region.

SIMS as used herein means secondary ion mass spectrometry.

Specimen as used herein means an object analyzed by the analytical instrument. The specimen can be a biological, organic, or inorganic object.

Sparse as used herein refers to data coming from analytical probes, detectors, and/or sensors and subsequently arranged in an array or matrix, wherein most of the elements are empty or zero. Sparse sampling, as used herein, refers to sub-sampling such that the result is an array of data that is sparse. Sparsity is a necessary condition for data to be processed according to many computational imaging techniques including those of compressive sensing and inpainting.

STEM as used herein means scanning transmission electron microscopy.

Step size as used herein means the basic physical unit of movement associated with the position of the analytical probe relative to the specimen as the analytical probe traverses the scan path Sub-sampling as used herein means using an analytical probe to sample a specimen at fewer acquired positions than the maximum possible. It can refer to acquiring measurements at a rate that is less than the full, pixel-by-pixel sampling rate of an analytical probe in an analytical instrument. In some embodiments, the sub-sampling rate is less than or equal to 80% of the full sampling rate. In certain embodiments, the sub-sampling rate is less than or equal to 50%, 40%, 33%, 30%, 25%, 20%, 15%, 10%, 8%, 5%, 3%, 2%, or 1% of the full sampling rate.

Disclosed are sparse sampling analytical probe systems and sparse sampling methods using the same. In general, embodiments disclosed herein minimize both acquisition time and observer effects while acquiring data necessary for reconstruction of representations of actual information regarding the specimen. Accordingly, the inventors have determined systems and methods for obtaining the fewest necessary samplings in the least amount of time for serial data acquisitions in analytical instruments using a scanning probe. In many instances, the representations resulting from embodiments described herein are substantially equivalent to representations constructed from full sampling.

In one embodiment, especially for analytical instrument systems with positioning systems associated with slow response dynamics, sampling by the analytical probe occurs along the scan path whereby measured values are acquired. In certain embodiments, the measured values acquired within a spatial area on the specimen corresponding to the size of one pixel are averaged and then the averaged measured value is assigned to a respective pixel. According to the disclosed sparse sampling embodiments and in contrast to full pixel-by-pixel sampling, not every pixel has an assigned measured value. The analytical probe can be perturbed, thereby skipping a sampling position that would have normally been sampled.

In one embodiment, the analytical probe moves at a constant rate in a line toward a first direction in a fixed step size. In certain embodiments, the probe is randomly moved along a second direction to one of two possible positions: 1) no perturbation or 2) one of either a positive perturbation in the second direction according to the fixed step size or a negative perturbation in the second direction according to the fixed step size. In other embodiments, the probe is randomly moved along a second direction to one of three possible positions: 1) a positive perturbation in the second direction according to the fixed step size, 2) a negative perturbation in the second direction according to the fixed step size, and 3) no perturbation. A predetermined boundary constraint limits the total distance (i.e., the number of steps)

away from the line that the analytical probe is allowed to travel. The number of steps allowed by the predetermined boundary constraint is related to the amount of sub-sampling.

Referring to the illustration in FIG. 1 as an example, the first direction is parallel to an x-axis and the second direction is parallel to a y-axis in a X-Y coordinate system. In the illustration, a pixel array overlays the scan region. The analytical probe rasters through a scan region by moving along the x direction from left to right and then flies back to the beginning when the probe reaches the end of a row. In a conventional full sampling, the probe acquires measurements at each and every pixel along each horizontal row of pixels. The probe then flies back to the beginning and moves down vertically to scan the next lower row of pixels.

According to one embodiment, employing a 50% sub-sampling involves the analytical probe moving at a constant rate in a horizontal direction and having vertical perturbations in the vertical direction. The vertical perturbations are limited within a band comprising two rows of pixels. In another embodiment, the vertical perturbations are limited within a band comprising three rows of pixels. The result is a 33% sub-sampling. In yet another embodiment, the vertical perturbations are limited within a band comprising five rows of pixels. The result is a 20% sub-sampling. In one embodiment, there is no overlap along the second direction between bands. In some embodiments, the number of steps (i.e., pixels) in a band is inversely proportional to the amount of sub-sampling. An additional advantage of line-hop sub-sampling is a reduction in total acquisition time and/or analytical probe exposure by eliminating a substantial portion of the fly-back time as the beam samples larger portions of the specimen at once.

The scan path described in FIG. 1 comprises a line extending toward a first direction, which is parallel to an x-axis in a XY coordinate system. Perturbations occurred in the second direction, which was parallel to a y-axis. A plurality of lines extending toward a first direction can be repeated as part of a scan path by which measured values can be acquired over the entire sample region. In some embodiments, spacing between each of the plurality of lines can vary. The spacing, or the number of steps between each of the plurality of lines (e.g., each row), Similarly, the step size in along the first direction can vary between each of the plurality of lines (e.g., each row).

Figure 2A:
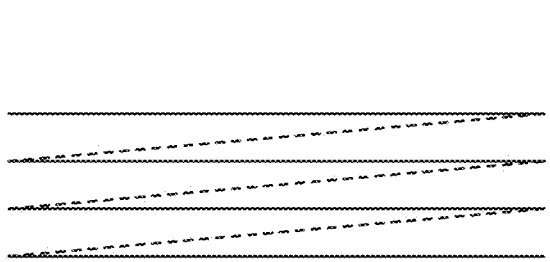
FIGS. 2A-2F are illustrations representing line forms that can compose components of scan paths according to embodiments disclosed herein. Perturbations along the second direction are not shown.
Figure 2B:
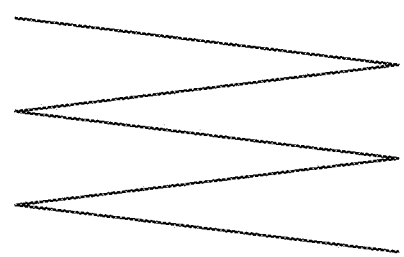
Figure 2C:
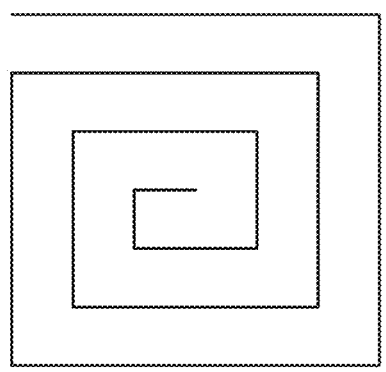
Figure 2D:
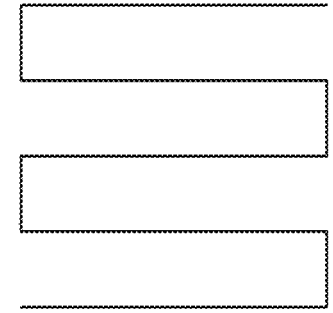
Figure 2E:
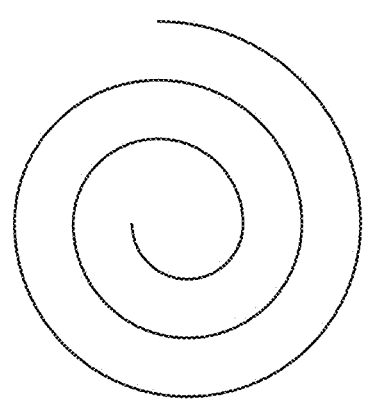
Figure 2F:
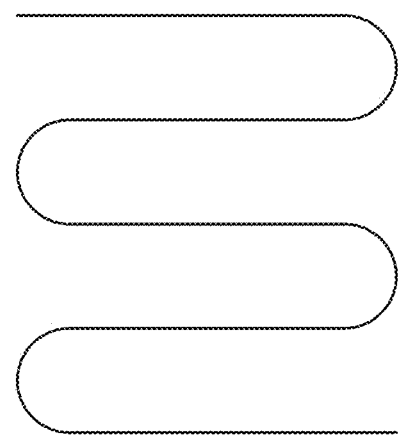

FIG. 2A is an illustration of the first-direction component of the scan path shown in FIG. 1. FIG. 2B-2F are illustrations of other examples of the first-direction component of the scan path in which perturbations in the second direction are not shown. FIG. 2B is an illustration of a sawtooth line form. FIG. 2C is an illustration of a spiral quadrilateral line form. FIG. 2D is an illustration of a rectangular wave line form. FIG. 2E is an illustration of a spiral line form. FIG. 2F is an illustration of a serpentine line form.

We use Kruskal factor analysis (KFA) to learn a suitable sparse representation from the sub-sampled data. KFA is a patch-based (small image segments) statistical image model. The model is adapted to the inpainting and compressive sensing cases by noting that a matrix times a Gaussian random vector affects only the covariance of the posterior distributions. A Gibbs sampler was implemented to approximate the posterior of KFA. Beginning with a randomly initialized model, 40 samples (inpainted images) are rejected as burn-in (this allows the model parameters to reach a useful region of the probability space), then several hundred are averaged to find the maximum a posteriori reconstruction of the image.

In one embodiment, a magnification-specific, highly accurate beam response characterization is not necessary and is, therefore, not performed. In one embodiment, the sub-sampling is performed using a constant dwell time and/or signal to noise ratio at each pixel.

In one embodiment, embodiments described herein lower the dose and acquisition time by a factor of at least 5 for atomic-resolution analysis, without requiring significant modifications to the analytical instrument.

Figure 3A:
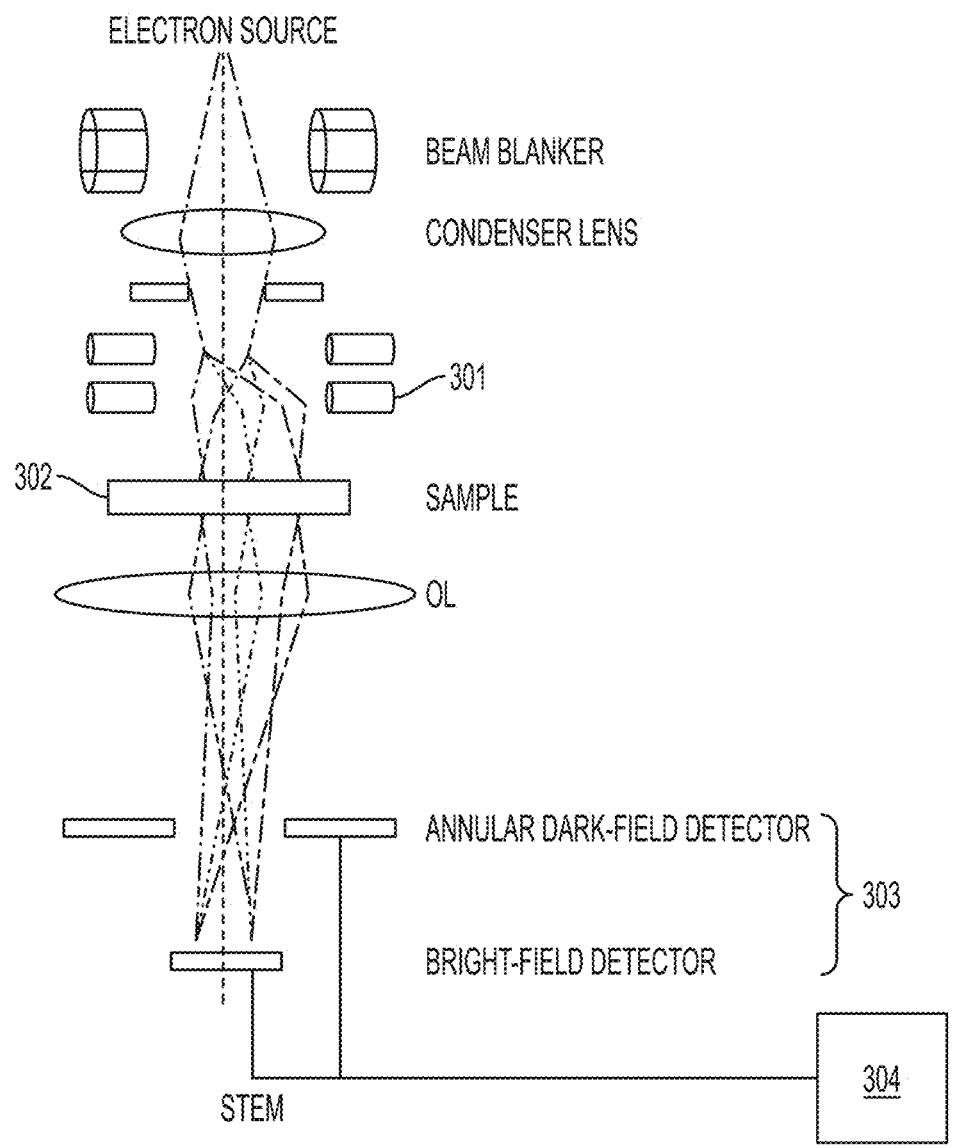
FIGS. 3A-3E are illustrations representing different analytical instruments including a STEM (FIG. 3A), a SEM (FIG. 3B), a SIMS (FIG. 3C), an AFM (FIG. 3D), and a scanning near-field optical spectrometer (FIG. 3E).
Figure 3B:
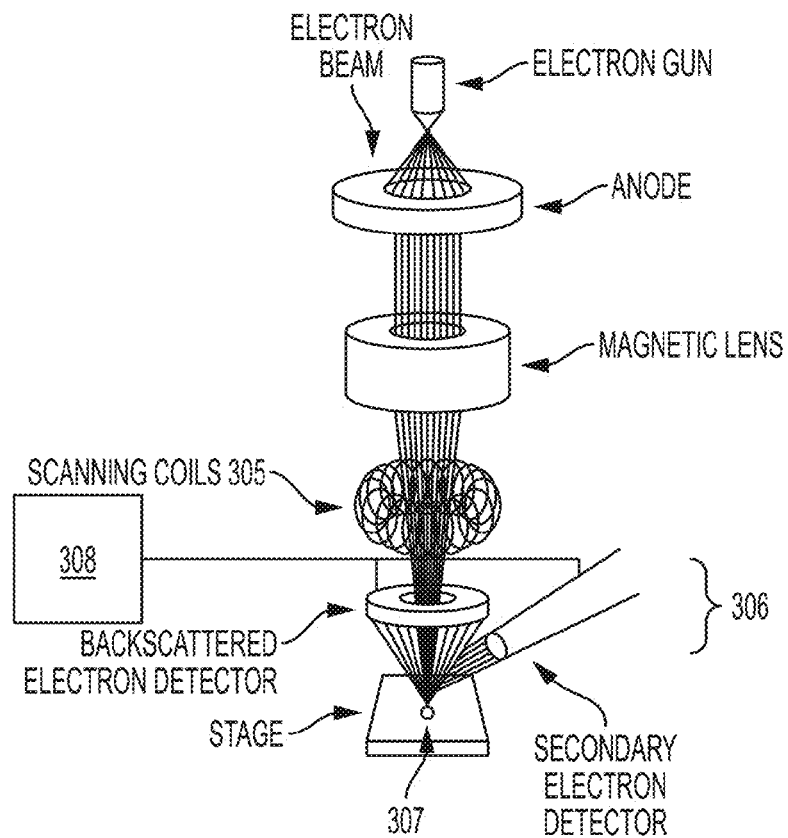

Referring to FIGS. 3A and 3B, in certain embodiments, the analytical instrument can be an electron microscope, including STEM, TEM, and SEM, and the analytical probe comprises an electron beam. The positioning system can comprise electromagnetic scan coils and/or electrostatic plates. The beam dynamics can be attributed at least in part to induction, which results in delays between the target beam position and the actual beam position. As illustrated in FIG. 3A, the positioning system can comprise scan coils 301 for moving the electron beam 302 relative to the specimen in a TEM. Similarly, in a SEM (see FIG. 3B), scan coils 305 move the electron beam probe 307 relative to the specimen. Detectors 303 in a TEM and detectors 306 in a SEM acquire measured values and provide them to an inpainting reconstruction system 304 and 306, respectively.

Figure 3C:
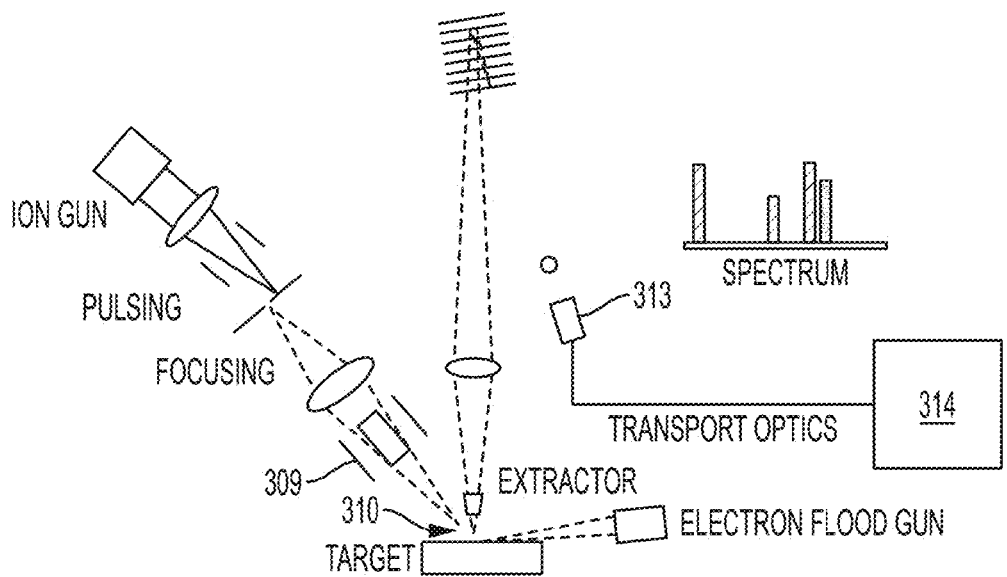

Referring to FIG. 3C, in one embodiment, the analytical instrument is a SIMS and the analytical probe comprises an ion beam 310. The positioning system 309 can comprise electromagnetic scan coils and/or electrostatic plates. The detector 313 can provide measured values to an inpainting reconstruction system 314.

Figure 3D:
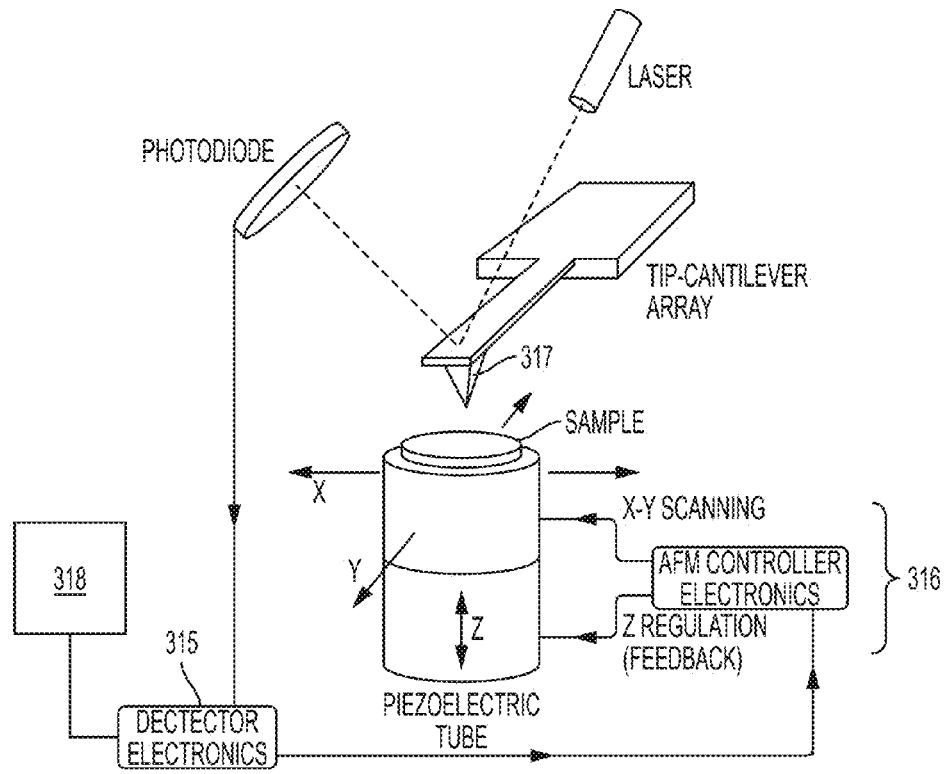

Referring to FIG. 3D, in one embodiment, the analytical instrument is an AFM and the analytical probe comprises an AFM nanotip 317 on a cantilever. The positioning system 316 can comprise piezoelectric elements that move and position the specimen relative to the nanotip. The detector 315 provides measured values to an inpainting reconstruction system 318.

Figure 3E:
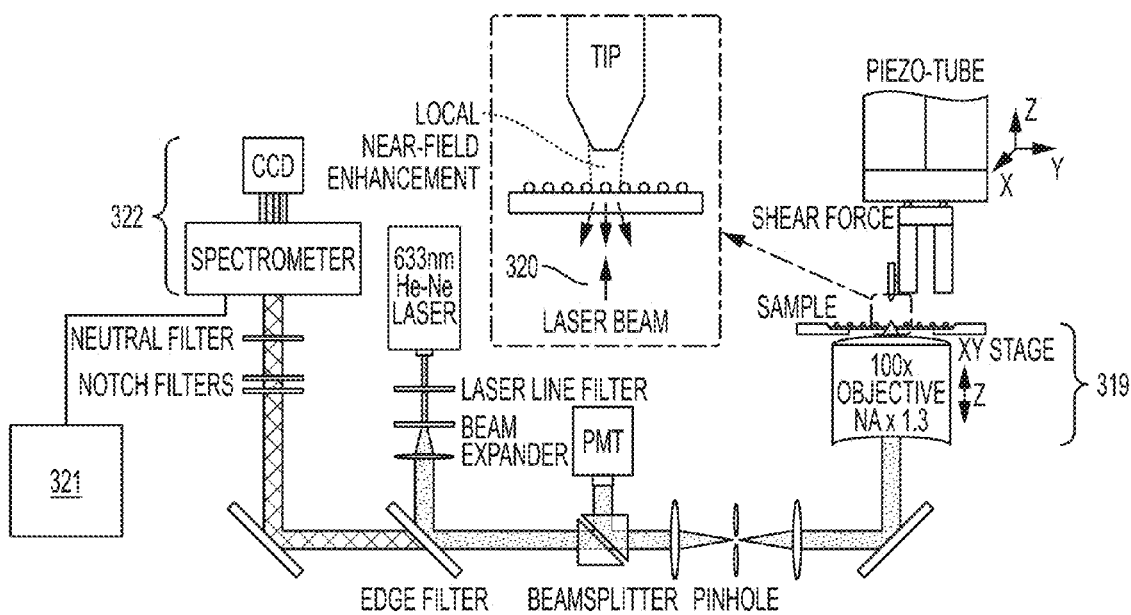

Referring to FIG. 3E, in one embodiment, the analytical instrument is a scanning near-field optical spectrometer and the analytical probe comprises an optical light beam 320. The positioning system 319 can comprise one of piezoelectric elements, optical lenses, apertures, mirrors, prisms, gratings and electromagnetic deflectors. The detector 322 can provide measured values to an inpainting reconstruction system 321.

The algorithms, computational techniques, and/or calculations described herein may be, for example, embodied as software or firmware instructions carried out by a digital computer. For instance, any of the disclosed inpainting techniques can be performed by a computer or other computing hardware (e.g., an ASIC, FPGA, CPLD, processor, etc.) that is part of a sparse sampling analytical probe system and/or an analytical instrument. The sparse sampling analytical probe system can have interconnections and communications among an analytical probe and a detector and be programmed or configured to read a data storage medium and perform the desired inpainting computations (e.g., one or more of the inpainting techniques disclosed herein). The computer can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed inpainting techniques. The results of the computations can be stored (e.g., in a suitable data structure or lookup table) in the one or more tangible, non-transitory computer-readable storage media and/or can also be used by other software programs or output to the user, for example, by displaying, on a display device, data read from the data storage medium. The results that are stored or outputted can include, but are not limited to, images, micrographs, video, spectra, diffraction patterns, hyperspectral images, and combinations thereof.

EXAMPLES AND COMPARISONS

Figure 4C:
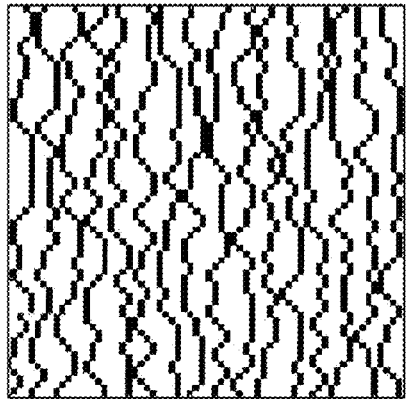
FIG. 4A-4F are images and graphs comparing theoretical sub-sampling by Bernoulli sampling and by line-hop.
Figure 4B:
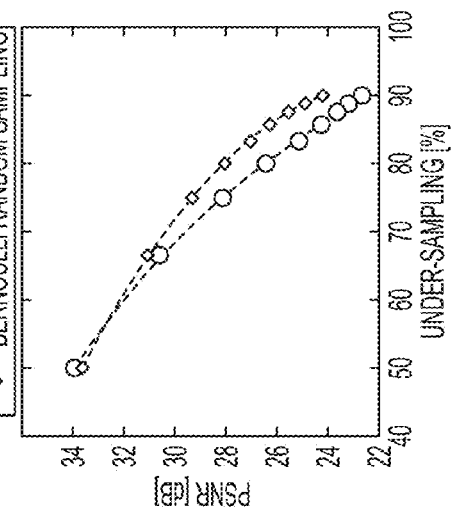
Figure 4A:
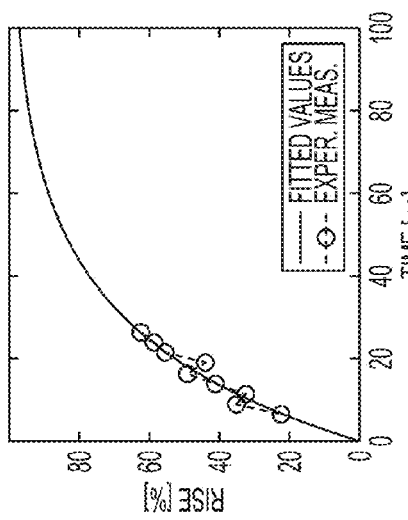

To further illustrate certain embodiments of the disclosed sparse sampling analytical probe system and methods of sparse sampling according to the same, and to provide various comparative analyses and data, below are some examples with comparison test data.
STEM Sparse Sampling Compared to 2D Bernoulli Pixel Sampling:

For comparison purposes, a two-dimensional Bernoulli pixel sampling, as shown in FIG. 4A, can be considered a "fully random" strategy for sparse sampling and inpainting. The Bernoulli pixel sampling has a very low degree of coherence, which permits a high degree of under-sampling without the introduction of reconstruction distortions. In theory, Bernoulli sampling could be accomplished by randomly changing the step size during acquisition, allowing the analytical probe to move by a random number of pixels in any direction. However, practically implementing sparse sampling by randomly changing the step size requires that each random analytical probe step can be realized in a much shorter time than the dwell time. In the case of conventional STEM imaging, the dwell time can be as short as a few microseconds.

The dynamic response associated with the scanning coils and the electron beam probe in a JEOL ARM200CF TEM was evaluated by measuring the beam rise time, which represents the response time for the beam probe to reach a desired set location. The rise time was evaluated from a pair of images acquired in interlaced fashion under different dwell times. As shown in FIG. 4B, we find that the time required for the beam to reach 90% of the desired location is approximately 60 μs, which is significantly higher than the dwell time used for conventional STEM imaging. Given this relatively long time and the complex response, it is clear that even for relatively long dwell times (approximately tens of microseconds), performing sparse sampling by changing the step size would lead to a situation where the beam movement is delayed from a specified setting during detector integration, and the set location will not only be dictated by current settings but also by after-effects of several previous beam settings. It should be noted that in a regular full scan (i.e., acquiring measured values at every pixel), a dwell time of only a few microseconds will not cause any image distortions because after the initial acceleration, which can occur over a distance equivalent to a few pixels, the beam reaches a steady state speed with the desired pixel size/dwell time. This is without any other additional corrections applied to the scan generator.

Figure 4F:
Figure 4E:
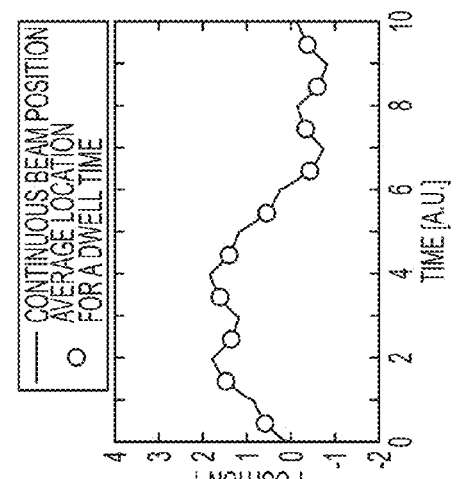
Figure 4D:
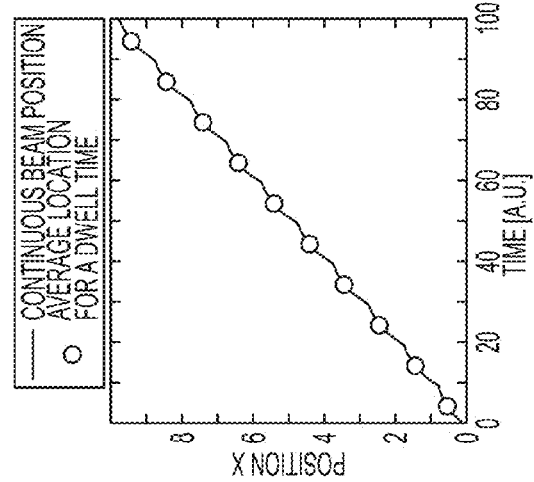
Figure 5A:
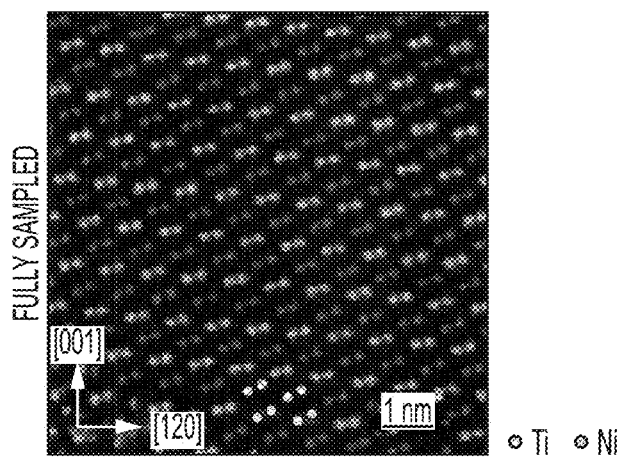
FIGS. 5A-5E are micrographs obtained from fully sampling and sub-sampling a NiTiO3 specimen.
Figure 5B:
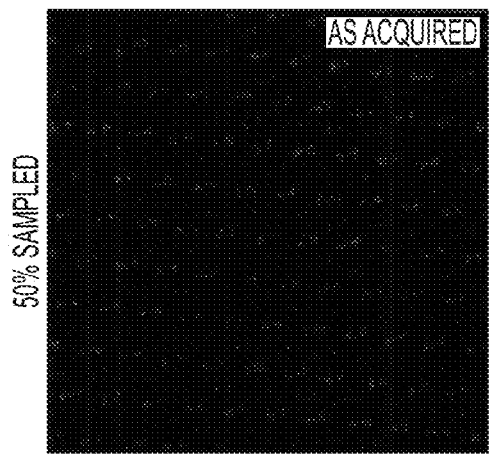
Figure 5C:
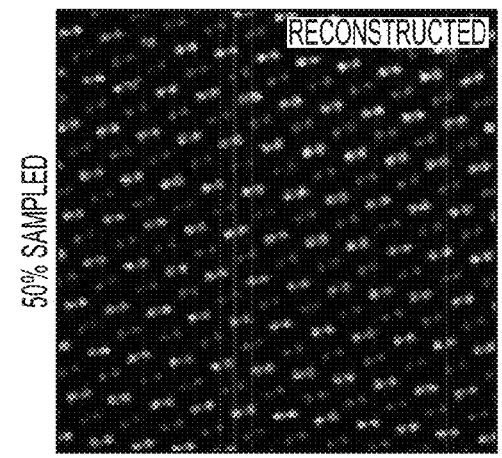
Figure 5D:
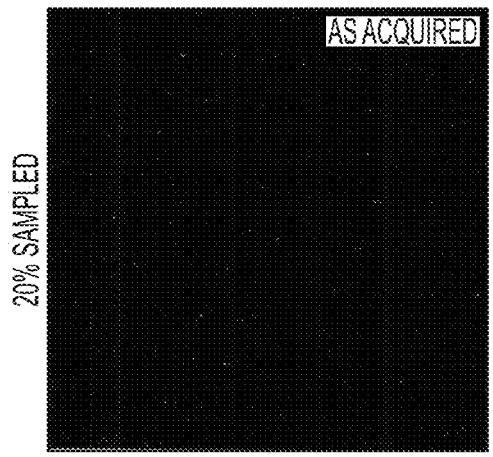
Figure 5E:
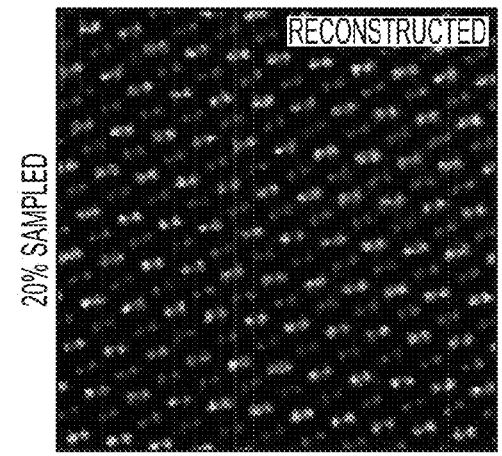

The issue of slow beam response in the TEM instrument can be overcome by line hopping according to embodiments disclosed herein. An illustration of sparse sampling according to one embodiment of line hopping is shown in FIG. 4C. The beam moves at constant speed along the horizontal (x) direction, while sampling a range of pixels along the vertical (y) direction. The step size is kept constant and each step corresponds to only a one pixel movement along x and y directions. Since the movement of the beam is constant along the x direction, just as in the case of a conventional scan, the average beam position along x is well defined. For the y direction, the beam randomly hops up or down, or does not hop, within a pre-defined range of pixels. To assure that the beam positions can be reliably driven and assigned to the underlying pixel grid, the dwell time can be restricted to a predefined range, as dictated by the rise time. In certain embodiments, dwell times greater than or equal to 50% of the rise time are sufficient. In other embodiments, dwell times corresponding to 70% to 90% of the rise time are sufficient. The simulated beam positions for the movement along the y direction (as well as the x direction) for a dwell time of 80% of the rise is shown in FIGS. 4D and 4E. As seen in FIG. 4E, the average position of the beam along the y direction is well within the center of the periodic grid, thus enabling a reliable pixel assignment. Dwell time that corresponds to only 70% of rise time translates to just over 30 μs on the JEOL ARM200CF, which is higher than the conventional time of approximately 10 μs, but still results in a time reduction when sparse sampling is employed, and it allows the total acquisition time to be relevant for high resolution imaging applications.

The theoretical performance of line-hopping sampling was compared with Bernoulli random sampling by reconstructing digitally sparsely sampled images, and comparing them on the basis of peak signal to noise ratio (PSNR). As shown in FIG. 4F, the highest quality of reconstruction (highest PSNR) is obtained for Bernoulli sampling. Line-hopping sub-sampling is expected to yield the same PNSR at 75% under-sampling as 80% under-sampling in the Bernoulli sampled image. At all but the highest levels of under-sampling the line-hopping approach is thus expected to provide an accurate reconstruction while optimizing the time for acquisition.
Implementation in a TEM The line-hopping acquisition described above was implemented on an aberration corrected JEOL ARM200CF. The scan coils and the imaging detector were controlled with a custom-built acquisition unit, using a National Instrument PCIe-6361 acquisition card. The analog output (AO) or digital-analog converter (DAC) was 16 bit, 2.86 MHz to control the X and Y positions. The analog input (AI) or analog-digital converter (ADC) is 16 bit, 2 MHz to read the high angle annular dark field (HAADF) detector. A Labview program was developed to control the acquisition of both regular (to test against the microscope acquisition system) and sparse acquisitions. The sparse positions for the line-hopping acquisition was pre-loaded as an input file, which was generated by a separate Fortran program. For the images shown here, the microscope was operated at 200 kV and the images were recorded on a High Angle Annular Dark Field (HAADF) detector. The inpainting reconstructions were performed with a beta-process factor analysis (BPFA) algorithm and run in Matlab. Although for the purposes of this demonstration the system for attaining a line-hopping scan was separate from the microscope's standard controls, there is no physical limitation that stops the approach being integrated with the normal microscope control systems.

NiTiO₃ TEM Micrographs

FIG. 5 shows micrographs of the atomic level microstructure of NiTiO₃, obtained with full sampling and with two sparse samplings at 50% and 20%, using the line-hopping as disclosed herein. The images were acquired with a dwell time of 31.35 μs and pixel array of 512×512. As shown in FIG. 5A of a fully sampled image of NiTiO₃ (R $\overline{3}$) from the [100] projection displays dumbbell motifs, with super-lattice intensity variation along the [001] direction. FIGS. 5B and 5D show images produced from the measured values with no imputated values determined by inpainting reconstruction. A comparison of the fully sample image (i.e., FIG. 5A) and the reconstructed images (i.e., FIGS. 5C and 5E) shows that a very high degree of image fidelity is maintained down to 20% sampling. Only small differences in the image quality for the 20% sampled image are observed as compared to the fully or 50% sampled images. Perhaps most noticeably, the definition of some reconstructed atomic columns is noisier. Nevertheless, the 20% sampled image maintains a high resolution and contrast that is representative of the fully sampled microstructure.

CaCO₃ TEM Micrographs

Figure 6A:
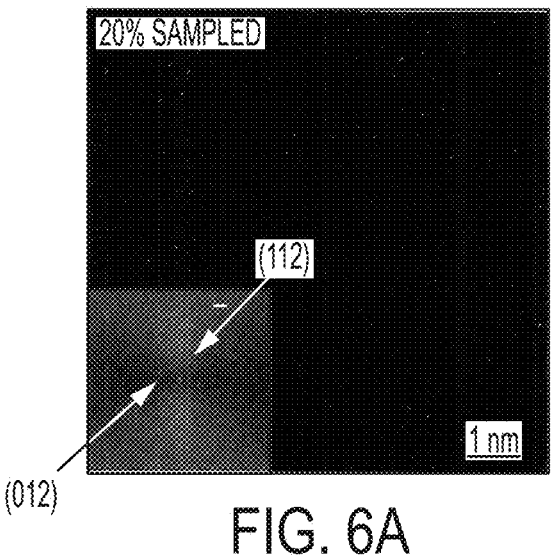
FIG. 6A-6B showing micrographs of a $CaCO_3$ specimen.
Figure 6B:
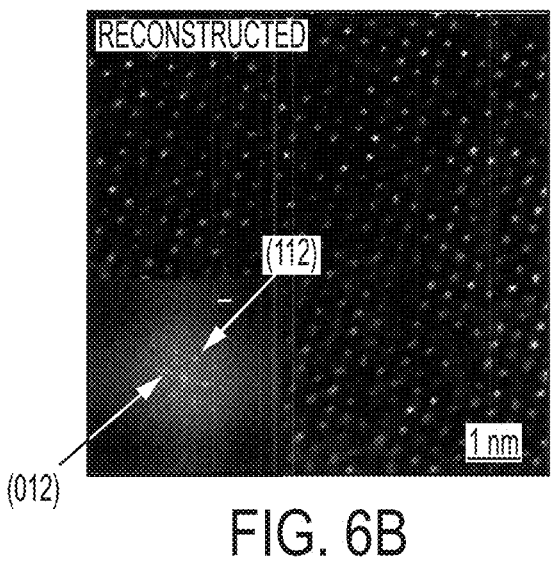

FIGS. 6A and 6B show, respectively, a sparsely acquired atomic resolution image of CaCO₃ along the [241] zone axis at 20% sampling, together with the corresponding inpainting reconstruction. The image was acquired with a 6 pA probe, and a total dose of 3175 $e^-/Å^2$. CaCO₃ is a highly sensitive material to electron beams and is very difficult to image at atomic resolution. A total dose of the order of 1000 $e^-/Å^2$ represents a threshold limit for the onset of observer-effect-related degradation, which results in transformation to CaO and CO₂. Line hopping embodiments disclosed herein enabled a reduction in the total dose to 3175 $e^-/Å^2$, which in turn enabled the resolution of the atomic structure of CaCO₃ in HAADF mode; the main lattice spacings of (112), (102), (104), and (210) can be clearly observed in the images. However, even under the reduced dose of the line-hopping acquisition, the onset of amorphization can be seen in the image. It is also worth noting that any subsequently acquired images from identical regions of the sample suffered from serious beam damage and amorphization.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A method for sparse sampling with an analytical probe, the method comprising:
    a) acquiring in a serial mode a plurality of contiguous measured values lying at positions along a scan path extending in a line toward a first direction and having random perturbations in a second direction, wherein the random perturbations are limited within a predetermined distance from the line; and
    b) inpainting among the measured values and reconstructing a representation of actual information.

2. The method of claim 1, further comprising repeating said acquiring step at different portions of a sample region, thereby acquiring measured values over substantially the entire sample region.

3. The method of claim 2, wherein a plurality of the lines are adjacent and resemble a serpentine line form or a sawtooth line form.

4. The method of claim 1, wherein the line has a curved form.

5. The method of claim 1, wherein said acquiring further comprises moving an analytical probe and a sample from which the measured values are acquired relative to one another.

6. The method of claim 1, wherein said acquiring further comprises holding an analytical probe at each of the positions from which measured values are acquired for a dwell time, the dwell time being less than a rise time associated with positional uncertainty of the analytical probe.

7. The method of claim 6, wherein the dwell time is greater than or equal to 50% of the rise time.

8. The method of claim 6, wherein the dwell time is between 70% and 90% of the rise time.

9. The method of claim 1, wherein said acquiring further comprises sensing a sample with a physical tip.

10. The method of claim 1, wherein said acquiring further comprises illuminating a sample with a charged particle beam, a neutral particle beam, an electromagnetic beam, or an optical beam.

11. The method of claim 10, wherein said illuminating comprises illuminating with a substantially constant illumination intensity.

12. A sparse sampling analytical probe system comprising:
    a) a scanner configured to move a sample and an analytical probe relative to one another and to scan the analytical probe over the sample along a scan path extending in a line toward a first direction and having random perturbations in a second direction, wherein the random perturbations are limited within a predetermined distance from the line;
    b) a detector configured to acquire in a serial mode a plurality of contiguous measured values lying at positions along the scan path; and
    c) a processor configured to apply inpainting techniques based on the measured values and to reconstruct a representation of actual information.

13. The system of claim 12, wherein the analytical probe comprises a charged particle beam, a neutral particle beam, an electromagnetic beam, or an optical beam.

14. The system of claim 13, wherein the analytical probe has a substantially constant illumination intensity at every position at which a measured value is acquired.

15. The system of claim 13, wherein the scanner comprises electromagnetic deflectors.

16. The system of claim 15, wherein the electromagnetic deflectors comprise scan coils.

17. The system of claim 13, wherein the scanner comprises electrostatic deflectors.

18. The system of claim 12, wherein the analytical probe comprises a physical tip.

19. The system of claim 18, wherein the scanner comprises piezoelectric manipulators, optical elements, or a combination thereof.

20. The system of claim 13, wherein the processor is configured to execute computer readable instructions including an inpainting solver stored in a memory device, the inpainting solver applying Bayesian dictionary learning techniques, beta-process factor analysis techniques, or combinations thereof.

21. The system of claim 13, wherein the representation of actual information comprises an image having N pixels, and the plurality of measured values is fewer than or equal to 1%, 2%, 3%, 5%, 10%, 15%, 20%, 25%, 30%, 33%, 40%, 50%, 60%, 70%, 80%, or 90% of the N pixels.

22. The system of claim 12, wherein the line comprises a continuous portion of a serpentine form or a sawtooth form.

23. The system of claim 12, wherein the line has a curved line form.

24. The system of claim 12, the scanner further configured to hold the analytical probe at each of the positions from which measured values are acquired for a dwell time, the dwell time being less than a rise time associated with positional uncertainty of the analytical probe.

25. The system of claim 24, wherein the dwell time is greater than or equal to 50% of the rise time.

26. The system of claim 25, wherein the dwell time is between 70% and 90% of the rise time.

* * * * *